US009502147B2

(12) United States Patent
Reece

(10) Patent No.: US 9,502,147 B2
(45) Date of Patent: Nov. 22, 2016

(54) COUPLING BETWEEN NANOSTRUCTURES AND OPTICAL FIBERS

(71) Applicant: Empire Technology Development LLC, Wilmington, DE (US)

(72) Inventor: Peter J. Reece, Blaxland (AU)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 188 days.

(21) Appl. No.: 14/458,202

(22) Filed: Aug. 12, 2014

(65) Prior Publication Data

US 2016/0049214 A1 Feb. 18, 2016

(51) Int. Cl.
| | | |
|---|---|---|
| *G21K 1/00* | (2006.01) | |
| *B82Y 40/00* | (2011.01) | |
| *G02B 6/26* | (2006.01) | |
| *B05C 3/12* | (2006.01) | |
| *B05C 3/20* | (2006.01) | |
| *C30B 11/12* | (2006.01) | |
| *C30B 29/60* | (2006.01) | |
| *C30B 29/02* | (2006.01) | |
| *C30B 29/06* | (2006.01) | |
| *C30B 29/16* | (2006.01) | |
| *C30B 29/40* | (2006.01) | |

(52) U.S. Cl.
CPC .............. *G21K 1/006* (2013.01); *B05C 3/12* (2013.01); *B05C 3/20* (2013.01); *C30B 11/12* (2013.01); *C30B 29/60* (2013.01); *G02B 6/262* (2013.01); *B82Y 40/00* (2013.01); *C30B 29/02* (2013.01); *C30B 29/06* (2013.01); *C30B 29/16* (2013.01); *C30B 29/40* (2013.01); *G21K 1/003* (2013.01); *Y10S 977/762* (2013.01)

(58) Field of Classification Search
CPC ........ G21K 1/003; G21K 1/006; G21K 1/00; B82Y 40/00
See application file for complete search history.

(56) References Cited

U.S. PATENT DOCUMENTS 7,663,202 B2 2/2010 Wang et al.

OTHER PUBLICATIONS

Xin et al., Optical trapping, driving, and arrangement of particles using a tapered fibre probe, Scientific Reports, 2:818, DOI: 10.1038, Nov. 12, 2012.*
"A Single Cell Endoscope at the End of a Nanowire," http://nanopatentsandinnovations.blogspot.In/2011/12/single-cell-endoscope-at-end-of.html, Dec. 20, 2011, pp. 1-20.

(Continued)

*Primary Examiner* — James M Mellott
(74) *Attorney, Agent, or Firm* — Turk IP Law, LLC

(57) ABSTRACT

Technologies are generally provided for enhancing optical coupling between nanostructures, such as a nanowire, and an optical element, such as an optical fiber, for example in order to enable effective optical communication. A nanostructure may be automatically aligned with an optical fiber by suspending the nanowire within a fluid and causing the nanowire to align itself with a tip of the optical fiber also suspended within the fluid. Light may be directed through the optical fiber to induce an optical gradient in the fluid near the optical fiber tip. The optical gradient may attract the nanowire to the tip of the optical fiber, and may cause to align with the optical fiber. Post-alignment, the nanowire may be permanently coupled with the optical fiber to form a nanowire-optical fiber assembly to couple light between the optical fiber and a nanophotonic circuit integrated with the nanowire.

16 Claims, 6 Drawing Sheets

(56) References Cited

OTHER PUBLICATIONS

"Optical tweezers," Wikipedia, accessed at http://en.wikipedia.org/wiki/Optical_tweezers, Last modified Jul. 27, 2013, pp. 1-13.
Barclay, P. E., et al., "Nonlinear response of silicon photonic crystal microresonators excited via an integrated waveguide and fiber taper," Optics Express, vol. 13, No. 3., pp. 801-820 (2005).
Birks, T. A. and Li, Y. W., "The shape of fiber tapers," Journal of Lightwave Technolog, vol. 10, No. 432-438 (1992).
Briggs, R. M., et al., "Efficient Coupling between Dielectric-Loaded Plasmonic and Silicon Photonic Waveguides," Nano Letters, vol. 10, No. 12, pp. 4851-4857 (2010).
Cai, M., et al., "Observation of Critical Coupling in a Fiber Taper to a Silica-Microsphere Whispering-Gallery Mode System," vol. 85, No. 1, pp. 74-77 (2000).
Delacour, C. C., et al., "Efficient Directional Coupling between Silicon and Copper Plasmonic Nanoslot Waveguides: toward Metal-Oxide-Silicon Nanophotonics," Nano Letters, vol. 10, No. 8, pp. 2922-2926 (2010).
Dong, C.-H., et al., "Coupling of light from an optical fiber taper into silver nanowires," Applied Physics Letters, vol. 95, American Institute of Physics (2009).
Durig, U., et al., "Near-field optical-scanning microscopy," Journal of Applied Physics, vol. 59, 3318-3327 (1986).
Guo, X. et al. "Direct Coupling of Plasmonic and Photonic Nanowires for Hybrid Nanophotonic Components and Circuits," Nano Letters, vol. 9, No. 12, pp. 4515-4519, American Chemical Society (2009).
Lazarev, A., et al., "Formation of fine near-field scanning optical microscopy tips. Part I," Review of Scientific Instruments, vol. 74, No. 8, pp. 3679-3683 (2003).
Lazarev, A., et al., "Formation of fine near-field scanning optical microscopy tips. Part II," Review of Scientific Instruments, vol. 74, No. 8, pp. 3684-3688 (2003).
Lee, Y.-E. K. and Kopelman, R., "Checking out the insides of cells," Nature Nanotechnology, vol. 7, pp. 148-149, Macmillan Publishers Limited (2012).
Liu, Z., et al., "Tapered fiber optical tweezers for microscopic particle trapping: fabrication and application," Optics Express, vol. 14, No. 25, pp. 12510-12516 (2006).
Love, J. D., et al., "Tapered single-mode fibres and devices. I. Adiabaticity criteria," IEE Proceedings J Optoelectronics, vol. 138, No. 5, pp. 343-354 (1991).
Mohanty, S. K., et al., "Organization of microscale objects using a microfabricated optical fiber," Opt Lett., vol. 33, No. 18, pp. 2155-2157 (2008).
Na, Y.-R. "Probing Enzymatic Activity inside Living Cells Using a Nanowire-Cell "Sandwich" Assay," Nano Letters, vol. 13, pp. 153-158, American Chemical Society (2013).
Pauzauskie, P. J., et al., "Optical trapping and integration of semiconductor nanowire assemblies in water," Nature Materials, vol. 5, pp. 97-101, Nature Publishing Group (2006).
Tian, J. et al., "Nanowaveguides and couplers based on hybrid plasmonic modes," Appl. Phys. Lett., vol. 97, pp. 231121, Dec. 2010.
Wadsworth, W. J., et al., "Supercontinuum generation in photonic crystal fibers and optical fiber tapers: a novel light source," Josa B, vol. 19, Issue 9, pp. 2148-2155, Sep. 2002.
Ward, J. M.et al., "Heat-and-pull rig for fiber taper fabrication," Review of Scientific Instruments, vol. 77, No. 8, pp. 083105-1-083105-5 (2006).
Yan, R., et al., "Nanowire-based single-cell endoscopy," Nature Nanotechnology, vol. 7, No. Issue 3, pp. 191-196 (2011).
Yang, P., et al., "Semiconductor nanowires, what's next?," Nano Letters, vol. 10, pp. 1529-1536 (2010).

\* cited by examiner

COMPUTER PROGRAM PRODUCT 600

SIGNAL BEARING MEDIUM 602

604 AT LEAST ONE OF

ONE OR MORE INSTRUCTIONS TO SUSPEND NANOSTRUCTURES IN A FLUID TO FORM A NANOSTRUCTURE SUSPENSION;

ONE OR MORE INSTRUCTIONS TO INSERT A FIRST END OF AN OPTICAL FIBER INTO THE NANOSTRUCTURE SUSPENSION;

ONE OR MORE INSTRUCTIONS TO COUPLE A LIGHT SOURCE TO A SECOND END OF THE OPTICAL FIBER; AND/ OR

ONE OR MORE INSTRUCTIONS TO DIRECT LIGHT FROM THE LIGHT SOURCE INTO THE SECOND END OF THE OPTICAL FIBER TO INDUCE AN OPTICAL GRADIENT FORCE WITHIN THE NANOSTRUCTURE SUSPENSION PROXIMATE TO THE FIRST END OF THE OPTICAL FIBER SUCH THAT AT LEAST ONE NANOSTRUCTURE IS ALIGNED BY THE INDUCED OPTICAL GRADIENT FORCE AT THE FIRST END OF THE OPTICAL FIBER.

| COMPUTER-READABLE MEDIUM 606 | RECORDABLE MEDIUM 608 | COMMUNICATIONS MEDIUM 610 |

FIG. 6

COUPLING BETWEEN NANOSTRUCTURES AND OPTICAL FIBERS

BACKGROUND

Unless otherwise indicated herein, the materials described in the section are not prior art to the claims in the application and are not admitted to be prior art by inclusion in the section.

A number of emerging technologies offer a potential route to high-density integration of photonic components such as self-assembled nanowires, slot waveguides, photonics crystal waveguides, and plasmonic waveguides. Integrated photonic and nanophotonic components and circuits are of great interest in producing compact, power efficient, and low cost devices that can handle optical data routing and processing, and may have applications in areas such as optical signal regeneration and wavelength routing for high-bandwidth optical telecommunications. A challenge of interfacing with high-density optical circuits is that waveguide cross-sections in nanophotonic architectures are very small, often less than a few hundred nanometers, and strongly confined optical modes they support may experience severe diffraction at the ends of light guiding structures if not well aligned.

SUMMARY

The following summary is illustrative only and is not intended to be in any way limiting. In addition to the illustrative aspects, embodiments, and features described above, further aspects, embodiments, and features will become apparent by reference to the drawings and the following detailed description.

According to some examples, methods to enhance optical coupling between at least one nanostructure and an optical fiber are provided. An example method may include suspending nanostructures in a fluid to form a nanostructure suspension. The nanostructures may include the at least one nanostructure and a polarizable material. The example method may additionally include inserting a first end of the optical fiber into the nanostructure suspension, coupling a light source to a second end of the optical fiber, and directing light from the light source into the second end of the optical fiber to induce an optical gradient force within the nanostructure suspension proximate to the first end of the optical fiber such that the at least one nanostructure may be aligned by the induced optical gradient force at the first end of the optical fiber.

According to some examples, systems having an optical coupling between a nanostructure and an optical fiber are described, in some examples providing an enhanced coupling due to improved alignment. An example system may include a single mode optical fiber, nanostructures, and a light source. The single mode optical fiber may be tapered from a wider diameter at a second end to a narrower diameter at a first end. The nanostructures may be suspended in a microfluidic suspension fluid contained in a fluidic chamber, where the first end of the optical fiber may be configured to be inserted into the fluidic chamber. The light source may be coupled with the second end of the optical fiber to direct light through the optical fiber, where the light source may be one of a visible laser and an infrared laser and may be configured to induce an optical gradient force at the first end of the optical fiber such that the nanostructures are directed near the first end of the optical fiber and at least one nanostructure may be aligned with one of the first end of the optical fiber and a long axis of the at least one nanostructure parallel to a long axis of the optical fiber in response to the optical gradient force.

According to some examples, methods to fabricate a nanostructure-optical fiber assembly coupled with a target device are provided. An example method may include suspending nanostructures in a suspension fluid to form a nanostructure suspension, inserting a first end of an optical fiber into the nanostructure suspension, and coupling a light source with a second end of the optical fiber. The example method may additionally include directing light from the light source into the second end of the optical fiber to induce an optical gradient force at the first end of the optical fiber such that at least one nanostructure may be aligned with the first end of the optical fiber due to the optical gradient force and affixing the at least one aligned nanostructure to the first end of the optical fiber to form a nanostructure-optical fiber assembly. The example method may also include optically coupling the nanostructure-optical fiber assembly to the target device, removing the nanostructure-optical fiber assembly from the nanostructure suspension prior to optically coupling the nanostructure-optical fiber assembly to the target device, and inserting the at least one affixed nanostructure to the optical fiber within a registration groove of the target device.

BRIEF DESCRIPTION OF THE DRAWINGS

The foregoing and other features of the disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings, in which:

FIG. 6 illustrates a block diagram of an example computer program product, all arranged in accordance with at least some embodiments described herein.

DETAILED DESCRIPTION

Figure 1:
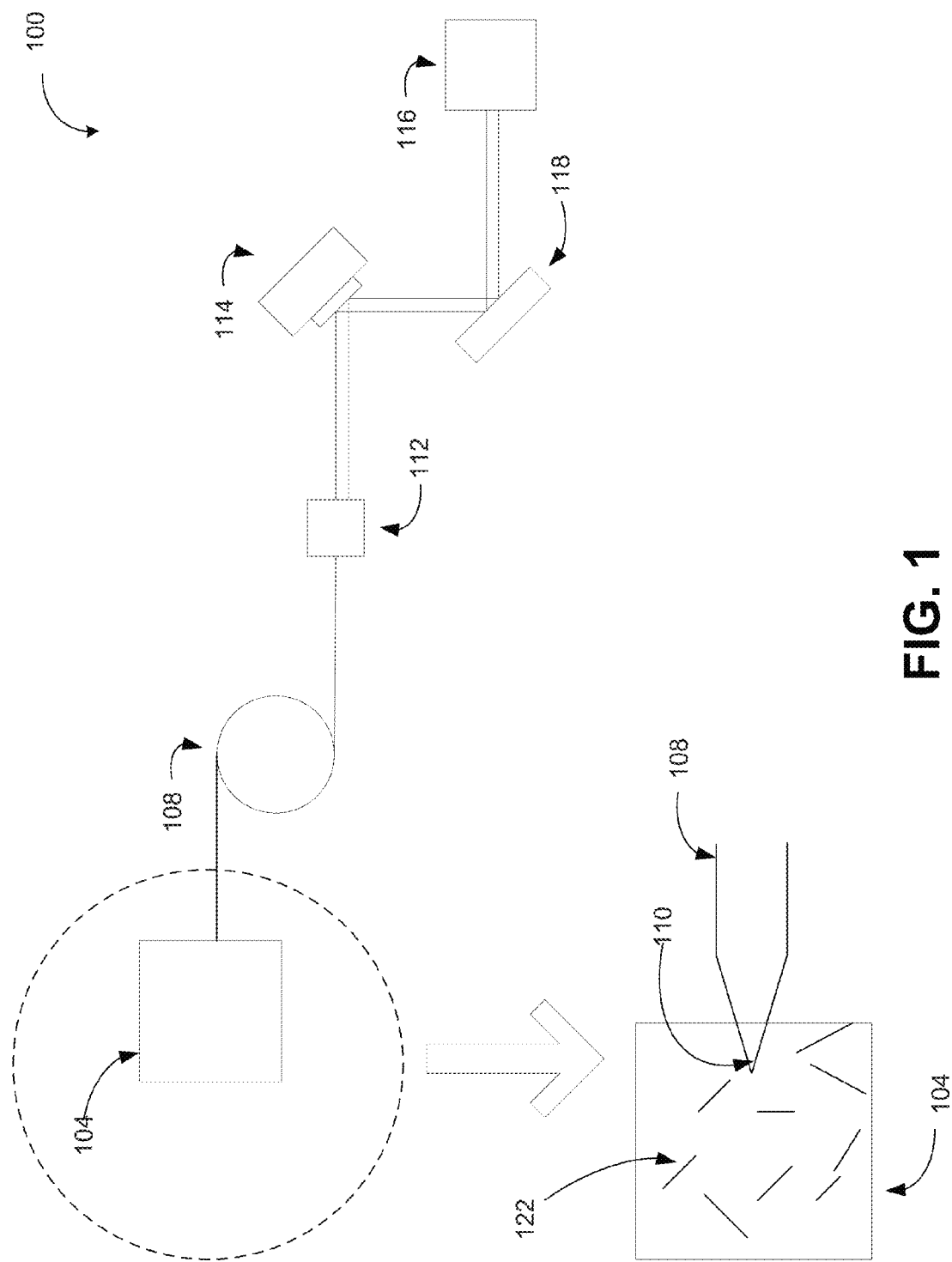
FIG. 1 illustrates an example configuration to couple an optical fiber with nanostructures suspended within a fluidic chamber.

In the following detailed description, reference is made to the accompanying drawings, which form a part hereof. In the drawings, similar symbols identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The disclosure is generally drawn, inter alia, to compositions, methods, apparatus, systems, and/or devices related to enable, for example, coupling enhancement between a nanostructure, such as a nanowire, and an optical fiber.

Briefly stated, technologies are generally provided for enhancing optical coupling between nanostructures, such as a nanowire, and an optical element, such as an optical fiber, for example in order to enable effective optical communication. A nanostructure may be automatically aligned with an optical fiber by suspending the nanowire within a fluid and causing the nanowire to align itself with a tip of the optical fiber also suspended within the fluid. Light may be directed through the optical fiber to induce an optical gradient in the fluid near the optical fiber tip. The optical gradient may attract the nanowire to the tip of the optical fiber, and may cause to align with the optical fiber. Post-alignment, the nanowire may be permanently coupled with the optical fiber to form a nanowire-optical fiber assembly to couple light between the optical fiber and a nanophotonic circuit integrated with the nanowire.

FIG. 1 illustrates an example configuration to couple an optical fiber with nanostructures suspended within a fluidic chamber, arranged in accordance with at least some embodiments described herein.

As demonstrated in a diagram 100, an optical fiber 108 may be arranged in a configuration to enable alignment of the optical fiber 108 with a nanostructure, such as nanowires 122. Other example nanostructures may include a nanorod, a nanotube, and a nanodisk. An elongated nanostructure, such as a nanorod, comprising an electrically conductive material, such as a metal, may be termed a nanowire. In the example configuration of the diagram 100, the optical fiber 108 may be wrapped one or more times around a spool in a predefined fixed arrangement in order to maintain the optical fiber 108 under a predetermined tension. Transmission properties of the optical fiber are highly dependent on geometric factors, and maintaining the optical fiber 108 in a fixed arrangement under a predefined tension may prevent unwanted changes to the transmission properties of the optical fiber during alignment. The optical fiber 108 may be a single mode fiber, which may be an optical fiber having a smaller core diameter in a range from about 4 to about 8 micrometers dependent on an operating wavelength range, for example, and designed to carry a single mode of light. Alternatively, the optical fiber 108 may be a multi-mode fiber, which may be an optical fiber having a larger core diameter in a range from about 50 to about 100 micrometers dependent on an operating wavelength range, for example, and supporting more than one propagation mode through the optical fiber. In the diagram 100, an input light source 116 may direct an input light, such as a laser beam having a uniform beam profile, through an input end of the optical fiber 108. The input light may be reflected from one or more mirrors (e.g., mirrors 114 and 118) and directed into the input end of the optical fiber 108 through a microscope objective 112.

An output end 110 of the optical fiber 108 may be inserted into a fluidic or microfluidic environment, such as a fluidic chamber 104 containing a fluid. Self-assembled nanostructures, such as nanowires 122, may be dispersed and suspended within the fluid in the fluidic chamber 104. A self-assembled nanowire may be a naturally forming high-aspect ratio nanostructure with a cross-sectional diameter in a range from about 10 to about 1000 nanometers, and a length in a range from about 2 to about 15 micrometers, for example. The nanowires 122 may be composed from, or include: one or more semiconductor materials, such as Silicon (Si), Gallium Arsenide (GaAs) and Indium Phosphide (InP); one or more oxide materials such as Copper Oxide (CuO) and Zinc Oxide (ZnO); and/or one or more metal materials such as Gold (Au) and Silver (Ag), to name some examples. The nanowires 122 may be composed of a polarizable material, and electrically conducting nanowires may provide a stronger response because of enhanced polarizability due to free conduction band electrons. The nanowires 122 may be formed by growing the nanowires in a solution employing a chemical synthesis technique. In other embodiments, the nanowires 122 may be formed via epitaxial growth on a substrate employing a vapor-liquid-solid (VLS) technique.

The nanowires 122 may be characterized by good quality crystallinity and low surface roughness. For example, the nanowires may be single crystal nanostructures and may have a root mean square (RMS) surface roughness in a range from about 0.1 to about 0.2 nanometers. Surface roughness in nanoscale components may have an effect on optical, electrical, and thermal properties through scattering processes of photons, electrons or phonons, for example. For integrated photonics applications, surface roughness in a nanowire may cause incoherent scattering that increases propagation losses in optical wave-guiding structures, which may degrade the performance of devices such as nanowire lasers that rely on an establishment of a low loss optical feedback to establish lasing. Generally, self-assembled nanowires have smooth interfaces when compared to standard methods of nanoscale fabrication, such as electron beam lithography, reactive ion etching, or focused ion beam milling. For example, milling and etching may leave pits and grooves that have an RMS roughness that may be a significant fraction of the diameter of the wire, from about 1 to about 5 nanometers. Standard nanoscale fabrication may have an additional disadvantage due to induction of defects to the crystalline material which can reduce the optoelectronic properties through increased non-radiative recombination.

In an example embodiment, the output end 110 of the optical fiber 108 may be tapered. The tapered end of the optical fiber 108 may be reduced to about 10% of a cross-sectional diameter of the diameter of a non-tapered portion of the optical fiber 108. The rate of the taper, or the slope of the taper, may be selected such that optical modes propagating through the optical fiber 108 may reduce a mode profile with minimal power loss. The tapered end may be prepared employing established fabrication techniques. For example, the tapered end of the optical fiber 108 may be formed employing techniques such as chemical etching, mechanical polishing, and by drawing a region of the optical fiber 108 through a heating zone.

In a system according to some embodiments, the input light source 116 may be coupled with the input end of the optical fiber 108 employing a fiber connector (e.g., FC/PC) or a free-space coupler. The input light source 116 may be configured to produce a high intensity infrared laser light and/or visible laser light. When directed through the optical fiber 108, the laser light may produce a highly divergent beam at the output end of the optical fiber 108 with a high or highest intensity at an apex of the tapered output end 110. The power of the input laser light may be configured such that an optical gradient force may be generated at the output end of the optical fiber 108. In a system according to embodiments, the generated optical gradient force at the output end of the optical fiber 108 may be sufficient to manipulate the nanowires 122 suspended in the solution. An example optical gradient force may be in a range from about one to one hundred pico-Newtons.

In another example embodiment, the fluidic chamber containing the suspension fluid and suspended nanowires may be selected based on a type of nanowire included in the fluid. For example, a variety of fluidic chambers may be available, where each fluidic chamber may contain different sizes and/or materials of nanostructures to enable selection of nanostructures for a selected optical fiber type and size. A fluidic chamber with desired size and/or material nanostructures may be selected and integrated with the optical fiber tip.

Figure 2:
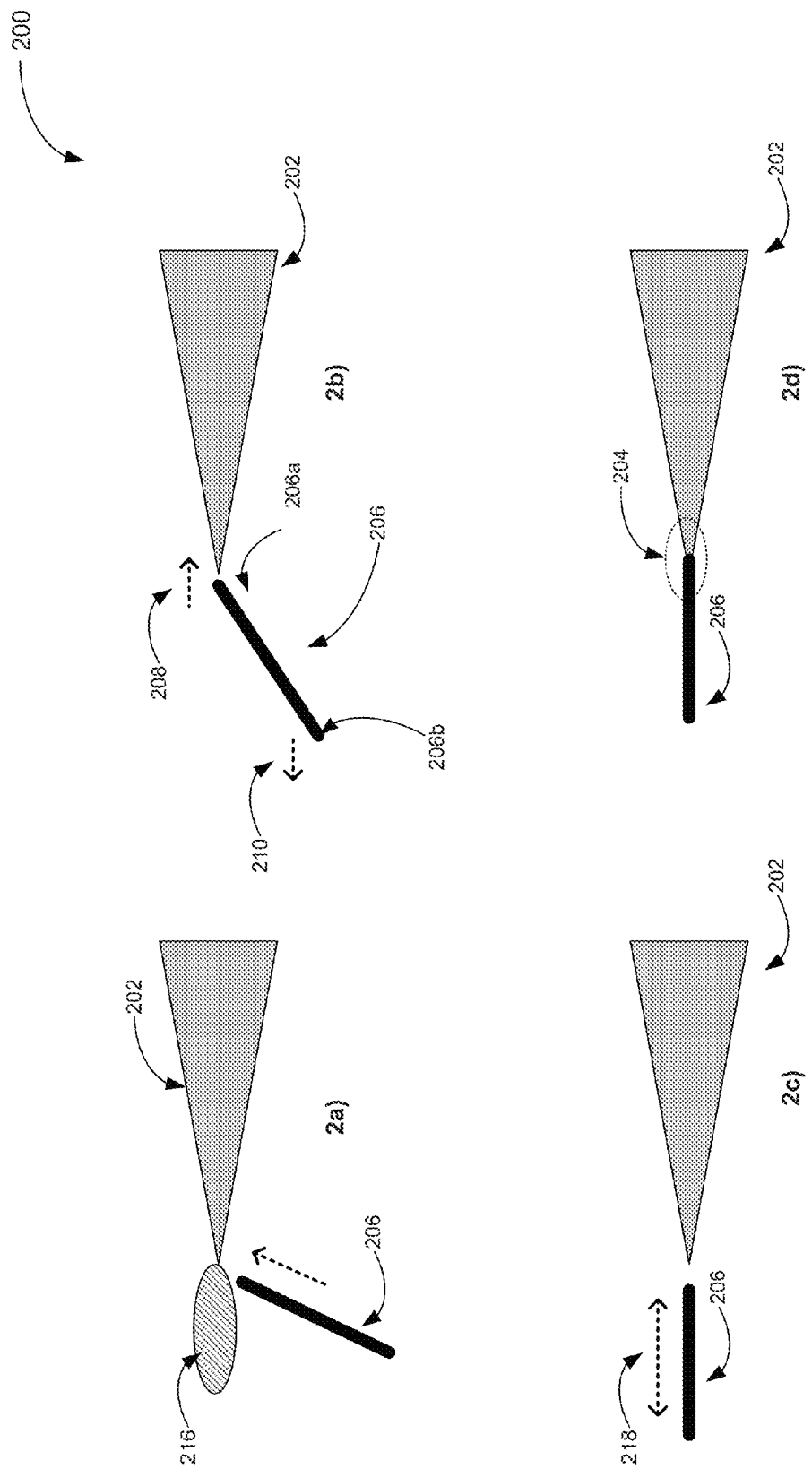
FIG. 2 illustrates an example alignment of a tip of a nanowire with an output end of an optical fiber.

FIG. 2 illustrates an example alignment of a tip of a nanowire with an output end of an optical fiber, arranged in accordance with at least some embodiments described herein.

A diagram 200 demonstrates different configurations (e.g., configurations 2a, 2b, 2c and 2d) of alignment of a nanostructure with a tapered end of an optical fiber 202. As described herein, a tip or tapered end of the optical fiber 202 may be inserted within a fluid in which nanostructures such as nanowires may be suspended. A light may be directed through the optical fiber in order to induce an optical gradient force 216 in proximity of a tip of the optical fiber 202.

In an example embodiment, a nanowire 206 within the fluid may be brought in close proximity to the tapered end of the optical fiber 202, and may be attracted or drawn into the optical gradient force 216. The nanostructures may be brought in close proximity to the tapered end of the optical fiber 202 by translating the tapered end of the optical fiber 202 within the fluid, and/or by directing the nanostructures to flow near the tip of the optical fiber 202 through one or more flow channels of a fluidic chamber comprising the fluid.

As illustrated in the configuration 2b, the optical gradient force 216 acting on the nanowire 206 in the vicinity of the tip of the optical fiber 202 may draw 208 one end 206a of the nanowire 206 to the highest intensity point near the tip of the optical fiber 202. More dispersed light further away from the tip apex may produce radiation pressure that may push 210 the opposite end 206b of the nanowire 206 away from the tip of the optical fiber 202, facilitating alignment of the nanowire with the optical fiber 202. As illustrated in the configuration 2c, in response to the optical gradient force drawing 208 one end of the nanowire 206 to the tip of the optical fiber and pushing 210 the opposite end 206b of the nanowire 206 away from the tip of the optical fiber 202, the nanowire 206 may be aligned 218 with the optical fiber 202 such that a long axis of the nanowire may be parallel to a long axis of the optical fiber 202.

As illustrated in the configuration 2d, once the nanowire 206 may be aligned with the optical fiber 202, the tip of the nanowire 206 may be coupled 204 with the optical fiber 202 to fix the nanowire 206 in place to form a nanostructure-optical fiber assembly. In an example embodiment, the nanowire 206 may be initially dispersed in a photopolymerizable coating or a photopolymerizable liquid (e.g., a photo resist) prior to being suspended in the fluid. The nanowire 206 may be fixed with the optical fiber 202 using two-photon polymerization. A pulsed laser light may be directed through the optical fiber 202 to illuminate the nanowire 206 which may cause polymerization of a portion of the photo-polymerizable liquid coating the nanowire 206 near the tip of the optical fiber 202. As the optical force gradient's highest intensity point may be at the tip of the optical fiber 202, the tapered geometry of the optical fiber 202 may localize the polymerization to the portion of the photo-polymerizable liquid coating the nanowire 206 near the tip of the optical fiber 202. The pulsed laser light may be an infrared-pulsed laser light, or may be an ultraviolet (UV) light. In another example, a tip of the nanowire 206 may be initially treated with a fluidic polymer prior to suspending within the fluidic chamber. The nanowire 206 may be illuminated with the pulsed laser light through the optical fiber 202 and a portion of the polymer at the tip of the nanowire 206 in contact with the tip of the optical fiber 202 may be solidified through polymerization.

In another embodiment, the nanowire 206 may be fixed with the optical fiber 202 by forming a chemical bond between the nanowire 206 and the optical fiber 202. For example, a chemical bond may be formed between a functional group supported by the nanowire and the tip of the optical fiber 202. After coupling the nanowire 206 with the optical fiber 202, the nanostructure-optical fiber assembly may be removed from the fluidic chamber.

In some embodiments, a large increase in the optical gradient force 216 may enable the nanowire 206 to overcome an electrostatic repulsion that may prevent the nanowire 206 from automatically affixing to the tip of the optical fiber 202. Once overcome, the nanowire 206 may come into direct contact with the tip of the optical fiber causing a Van der Waals attraction to affix the nanowire 206 to the tip of the optical fiber 202.

Figure 3:
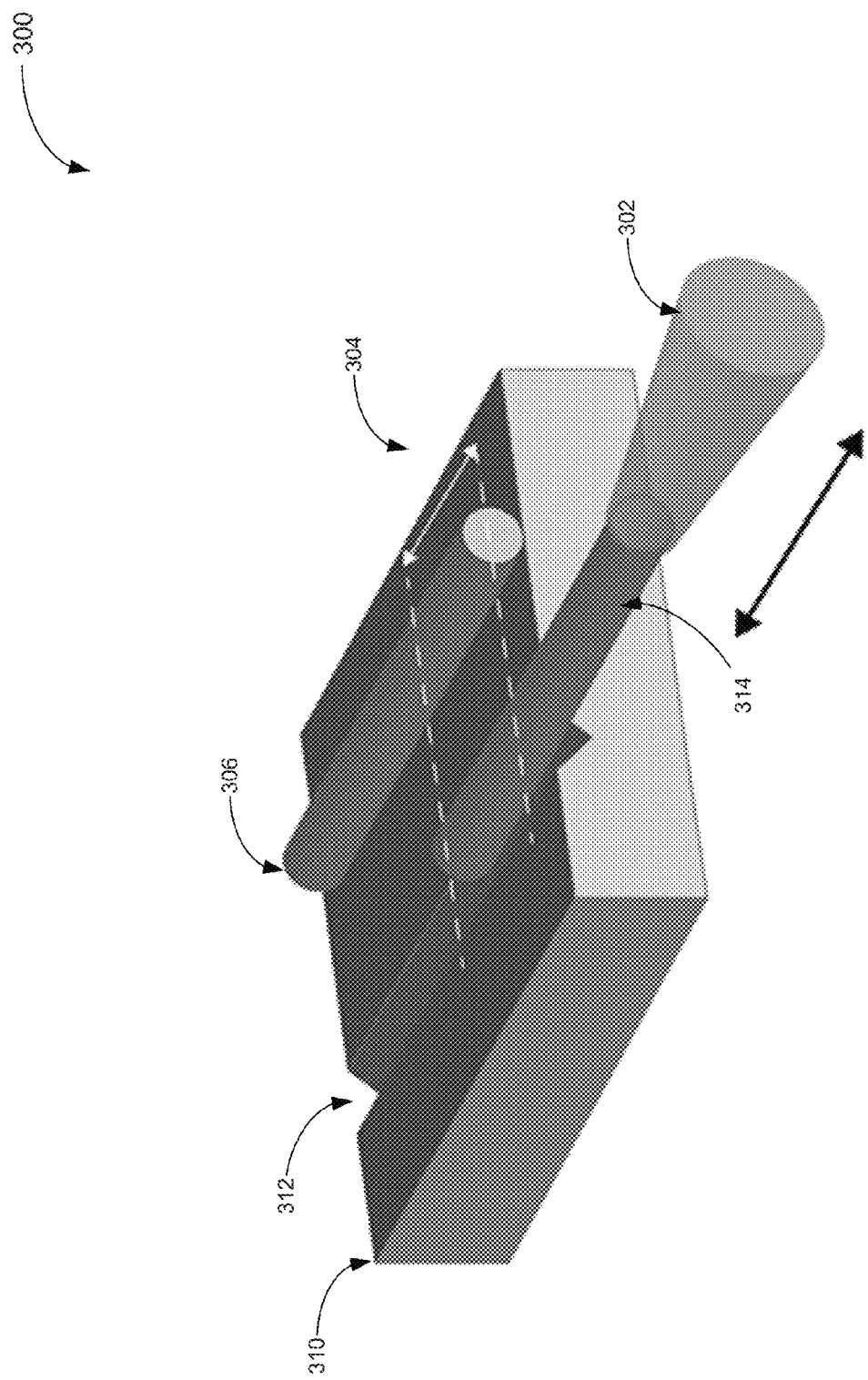
FIG. 3 illustrates an example coupling of a nanowire-optical fiber assembly with a target device.

FIG. 3 illustrates an example coupling of a nanowire-optical fiber assembly with a target device, arranged in accordance with at least some embodiments described herein. A similar approach may be used with other nanostructures.

After coupling a nanostructure, such as a nanowire, with an optical fiber to form a nanostructure-optical fiber assembly, the nanostructure-optical fiber assembly may be employed to interface with other integrated components and target devices. An example target device may be an integrated nanophotonic component that includes at least a second nanostructure affixed on a substrate. Examples allow effective interfacing of nanostructures with optical elements such as optical backplanes, optical fibers, optical fiber networks, optical infrastructure (e.g., including photonic circuits), photonic crystals, and plasmonic elements. In some examples, efficient connections for optical processing and optical communication are provided between one or more nanostructures and one or more optical elements.

FIG. 3 shows generally in a diagram 300 an example alignment configuration for coupling light to a second nanostructure, or nanowire, fixed on a substrate, or a target device. In an example embodiment, the nanostructure-optical fiber assembly may be positioned next to a second nanostructure on the target device such that a portion of the nanostructure-optical fiber assembly and a portion of the second nanostructure may overlap over an interaction length. There may exist coupled modes over the interaction length. A beat length of the coupled modes may be dependent on several parameters, including a modal confinement in each individual nanostructure, a mode profile of each nanostructure, frequencies of the coupled modes, and a separation between the nanostructures. Light may be directed through the nanostructure-optical fiber assembly, and the light may be transferred between the second nanostructure and the nanostructure-optical fiber assembly over the overlapping interaction length. Depending on the interaction length, light from the nanostructure-optical fiber assembly may be transferred to the target device, and additionally light from the target device may be transferred back to the nanostructure-optical fiber assembly. The interaction length may be adjusted to improve a transfer of light between the second nanostructure and the nanostructure-optical fiber assembly. The interaction length may be adjusted by adjusting a position of the nanostructure-optical fiber assembly in an axial direction.

In an example embodiment, the target device may include a registration groove to facilitate alignment of the nanostructure-optical fiber assembly. An example registration groove may be a groove, such as a v-shaped groove, on a surface of the target device. The nanostructure-optical fiber assembly may be inserted within the registration groove, which may enable an initial course alignment to within a few micrometers. After insertion within the registration groove, more precise alignment may be achieved employing precision alignment tools and techniques to align the nanostructure-optical fiber assembly with the second nanostructure of the target device.

In a system according to embodiments, using optically active nanostructure components may enable the target device to be employed as a functional nanophotonic component. For example, light emitting materials may be included within the nanostructure coupled with the optical fiber such that the nanostructure may absorb light from optical fiber, and may re-emit the light at a longer wavelength that may be improved for the target device as an integrated nanophotonic component. Additionally, different types of nanowires may be selected to couple to different types of target devices as integrated nanophotonic circuits. For example, in some scenarios, metallic nanowires may be better matched to couple to plasmonic waveguides.

Figure 4:
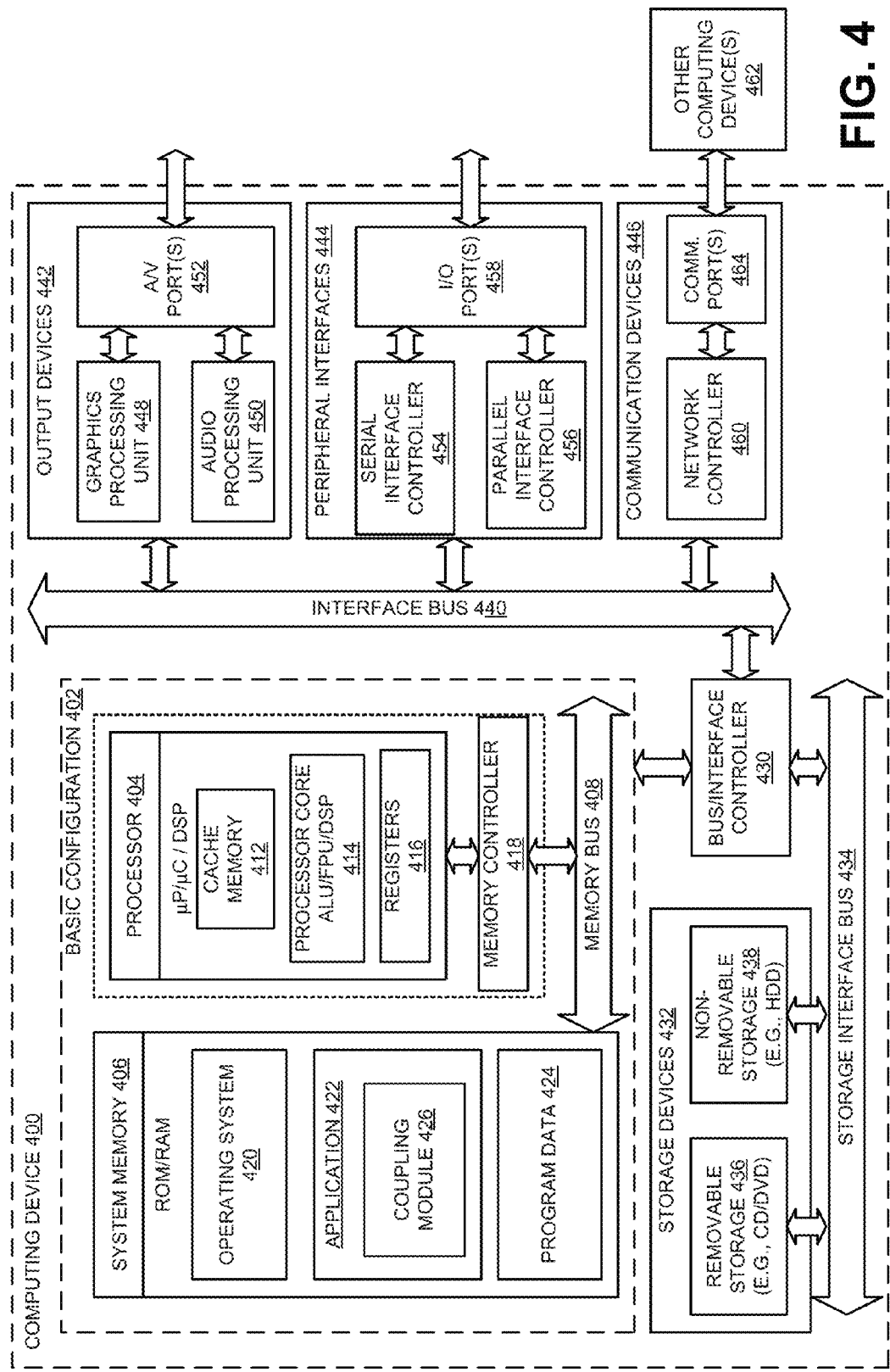
FIG. 4 illustrates a general purpose computing device, which may be used to enhance coupling between a nanowire and an optical fiber.

FIG. 4 illustrates a general purpose computing device, which may be used to enhance coupling between a nanowire and an optical fiber, arranged in accordance with at least some embodiments described herein.

For example, the computing device 400 may be used as a server, desktop computer, portable computer, smart phone, special purpose computer, or similar device. In an example basic configuration 402, the computing device 400 may include one or more processors 404 and a system memory 406. A memory bus 408 may be used for communicating between the processor 404 and the system memory 406. The basic configuration 402 may be illustrated in FIG. 4 by those components within the inner dashed line.

Depending on the desired configuration, the processor 404 may be of any type, including but not limited to a microprocessor (μP), a microcontroller (μC), a digital signal processor (DSP), or any combination thereof. The processor 404 may include one more levels of caching, such as a cache memory 412, one or more processor cores 414, and registers 416. The example processor cores 414 may (each) include an arithmetic logic unit (ALU), a floating point unit (FPU), a digital signal processing core (DSP Core), or any combination thereof. An example memory controller 418 may also be used with the processor 404, or in some implementations, the memory controller 418 may be an internal part of the processor 404.

Depending on the desired configuration, the system memory 406 may be of any type including but not limited to volatile memory (such as RAM), non-volatile memory (such as ROM, flash memory, etc.) or any combination thereof. The system memory 406 may include an operating system 420, one or more applications 422, and program data 424. The application 422 may include a coupling module 426, which may be an integral part of the application 422 or a separate application. The coupling module 426 may facilitate directing a light through an optical fiber to generate an optical gradient at an output end of the optical fiber within a fluid, and aligning a nanowire suspended within the fluid with the optical fiber in response to the generated optical gradient, as described herein. The program data 424 may include, among other data, data related to coupling a nanowire-optical fiber assembly with a target nanophotonic device, as described herein.

The computing device 400 may have additional features or functionality, and additional interfaces to facilitate communications between the basic configuration 402 and any desired devices and interfaces. For example, a bus/interface controller 430 may be used to facilitate communications between the basic configuration 402 and one or more data storage devices 432 via a storage interface bus 434. The data storage devices 432 may be one or more removable storage devices 436, one or more non-removable storage devices 438, or a combination thereof. Examples of the removable storage and the non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 406, the removable storage devices 436 and the non-removable storage devices 438 are examples of computer storage media. Computer storage media includes, but is not limited to, RAM, ROM, EEPROM, flash memory or other memory technology, CD-ROM, digital versatile disks (DVDs), solid state drives, or other optical storage, magnetic cassettes, magnetic tape, magnetic disk storage or other magnetic storage devices, or any other medium which may be used to store the desired information and which may be accessed by the computing device 400. Any such computer storage media may be part of the computing device 400.

The computing device 400 may also include an interface bus 440 for facilitating communication from various interface devices (for example, one or more output devices 442, one or more peripheral interfaces 444, and one or more communication devices 446) to the basic configuration 402 via the bus/interface controller 430. Some of the example output devices 442 include a graphics processing unit 448 and an audio processing unit 450, which may be configured to communicate to various external devices such as a display or speakers via one or more A/V ports 452. One or more example peripheral interfaces 444 may include a serial interface controller 454 or a parallel interface controller 456, which may be configured to communicate with external devices such as input devices (for example, keyboard, mouse, pen, voice input device, touch input device, etc.) or other peripheral devices (for example, printer, scanner, etc.) via one or more I/O ports 458. An example communication device 446 includes a network controller 460, which may be arranged to facilitate communications with one or more other computing devices 462 over a network communication link via one or more communication ports 464. The one or more other computing devices 462 may include servers, client devices, smart appliances, and comparable devices.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 400 may be implemented as a part of a general purpose or specialized server, mainframe, or similar computer that includes any of the above functions. The computing device 400 may also be implemented as a personal computer including both laptop computer and non-laptop computer configurations.

Example embodiments may also include methods to enhance optical coupling between a nanostructure and an optical fiber. These methods can be implemented in any number of ways, including the structures described herein. One such way may be by machine operations, of devices of the type described in the present disclosure. Another optional way may be for one or more of the individual operations of the methods to be performed in conjunction with one or more human operators performing some of the operations while other operations may be performed by machines. These human operators need not be collocated with each other, but each can be performed with a machine that performs a portion of the program. In other embodiments, the human interaction can be automated such as by pre-selected criteria that may be machine automated.

Figure 5:
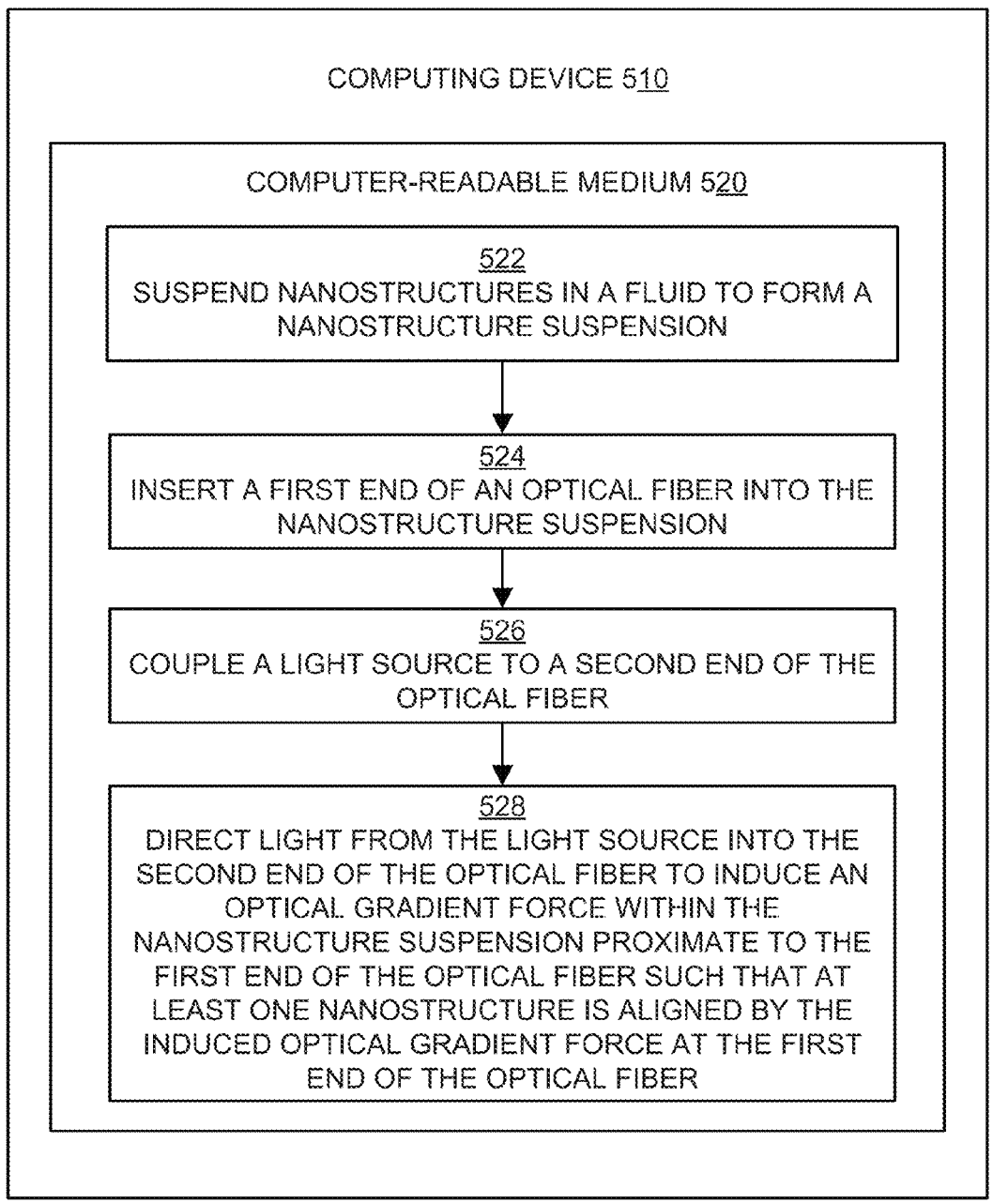
FIG. 5 is a flow diagram illustrating an example method to enhance coupling between a nanostructure and an optical fiber that may be performed by a computing device such as the computing device in FIG. 4.

FIG. 5 is a flow diagram illustrating an example method to enhance coupling between a nanostructure and an optical fiber that may be performed by a computing device such as the computing device in FIG. 4, arranged in accordance with at least some embodiments described herein.

Example methods may include one or more operations, functions or actions as illustrated by one or more of blocks 522, 524, 526, and/or 528. The operations described in the blocks 522 through 528 may also be stored as computer-executable instructions in a computer-readable medium such as a computer-readable medium 520 of a computing device 510.

An example process to enhance coupling between a nanostructure and an optical fiber may begin with block 522, "SUSPEND NANOSTRUCTURES IN A FLUID TO FORM A NANOSTRUCTURE SUSPENSION," where nanostructures, such as nanowires, may be dispersed within a fluid contained in a fluidic chamber to form a nanostructure suspension fluid. The nanostructures may vary in material and size.

Block 522 may be followed by block 524, "INSERT A FIRST END OF AN OPTICAL FIBER INTO THE NANO-STRUCTURE SUSPENSION," where an output end of an optical fiber may be inserted into fluidic chamber containing the nanostructure suspension. The output end of the optical fiber may be tapered from a wider diameter at an input end to a narrower diameter at the output end.

Block 524 may be followed by block 526, "COUPLE A LIGHT SOURCE TO A SECOND END OF THE OPTICAL FIBER," where a light source may be coupled to an input end of the optical fiber to direct light through the optical fiber.

Block 526 may be followed by block 528, "DIRECT LIGHT FROM THE LIGHT SOURCE INTO THE SECOND END OF THE OPTICAL FIBER TO INDUCE AN OPTICAL GRADIENT FORCE WITHIN THE NANO-STRUCTURE SUSPENSION PROXIMATE TO THE FIRST END OF THE OPTICAL FIBER SUCH THAT AT LEAST ONE NANOSTRUCTURE IS ALIGNED BY THE INDUCED OPTICAL GRADIENT FORCE AT THE FIRST END OF THE OPTICAL FIBER," where the light source may direct an input light, such as a laser, through the optical fiber to produce an optical gradient force within the nanostructure suspension at the output end of the optical fiber. The optical gradient force may attract the nanostructures near the output end of the optical fiber, and may induce at least one of the nanostructures to align itself along a long axis with the output end of the optical fiber.

The blocks included in the above described process are for illustration purposes. Enhancing coupling between a nanostructure and an optical fiber may be implemented by similar processes with fewer or additional blocks. In some embodiments, the blocks may be performed in a different order. In some other embodiments, various blocks may be eliminated. In still other embodiments, various blocks may be divided into additional blocks, or combined together into fewer blocks.

FIG. 6 illustrates a block diagram of an example computer program product, arranged in accordance with at least some embodiments as described herein.

In some embodiments, as shown in FIG. 6, the computer program product 600 may include a signal bearing medium 602 that may also include one or more machine readable instructions 604 that, when executed by, for example, a processor may provide the functionality described herein. For example, referring to the processor 404 in FIG. 4, a coupling module 426 executed on the processor 404 may undertake one or more of the tasks shown in FIG. 6 in response to the instructions 604 conveyed to the processor 404 by the signal bearing medium 602 to perform actions associated with aligning a nanostructure with an optical fiber. Some of those instructions may include, for example, instructions to suspend nanostructures in a fluid to form a nanostructure suspension, insert a first end of an optical fiber into the nanostructure suspension, couple a light source to a second end of the optical fiber, and direct light from the light source into the second end of the optical fiber to induce an optical gradient force within the nanostructure suspension proximate to the first end of the optical fiber such that at least one nanostructure is aligned by the induced optical gradient force at the first end of the optical fiber.

In some implementations, the signal bearing medium 602 depicted in FIG. 6 may encompass a computer-readable medium 606, such as, but not limited to, a hard disk drive, a solid state drive, a Compact Disc (CD), a Digital Versatile Disk (DVD), a digital tape, memory, etc. In some implementations, the signal bearing medium 602 may encompass a recordable medium 608, such as, but not limited to, memory, read/write (R/W) CDs, R/W DVDs, etc. In some implementations, the signal bearing medium 602 may encompass a communications medium 610, such as, but not limited to, a digital and/or an analog communication medium (for example, a fiber optic cable, a waveguide, a wired communications link, a wireless communication link, etc.). For example, the computer program product 600 may be conveyed to one or more modules of the processor 404 of FIG. 4 by an RF signal bearing medium, where the signal bearing medium 602 is conveyed by the wireless communications medium 610 (for example, a wireless communications medium conforming with the IEEE 802.11 standard).

According to some examples, methods to enhance optical coupling between at least one nanostructure and an optical fiber are provided. An example method may include suspending nanostructures in a fluid to form a nanostructure suspension. The nanostructures may include the at least one nanostructure and a polarizable material. The example method may additionally include inserting a first end of the optical fiber into the nanostructure suspension, coupling a light source to a second end of the optical fiber, and directing light from the light source into the second end of the optical fiber to induce an optical gradient force within the nanostructure suspension proximate to the first end of the optical fiber such that the at least one nanostructure may be aligned by the induced optical gradient force at the first end of the optical fiber.

In some examples, suspending the nanostructures in the fluid may include suspending the nanostructures in a microfluidic suspension fluid contained in a fluidic chamber, where the nanostructures may include one or more of a semiconductor, an oxide, and a metal. According to different examples, the example method to enhance the optical coupling between the at least one nanostructure and the optical fiber may additionally include forming a taper of the optical fiber near the first end employing one or more of chemical etching, mechanical polishing, and drawing a region of the optical fiber through a heating zone.

According to some examples, the light source of the example method may be one of an infrared laser and a visible laser. According to some examples, inserting the first end of the optical fiber into the nanostructure suspension may include translating the first end of the optical fiber within the fluid and directing the nanostructures to flow near the first end of the optical fiber through one or more flow channels within a fluidic chamber comprising the fluid.

According to other examples, the example method to enhance the optical coupling between the at least one nanostructure and the optical fiber may further include inducing the optical gradient force such that the at least one nanostructure may be attracted to the first end of the optical fiber and may be aligned with a long axis of the at least one nanostructure parallel to a long axis of the optical fiber in response to the optical gradient force. In some examples, the example method to enhance the optical coupling between the at least one nanostructure and the optical fiber may further include forming the nanostructures by one of a solution employing chemical synthesis and via epitaxial growth on a substrate employing a vapor-liquid-solid (VLS) method, where the nanostructures may be one of nanowires and single crystal nanostructures. In some examples, the nanostructures may have a root mean square (RMS) surface roughness in a range from about 0.1 to about 0.2 nanometers.

According to further examples, the example method to enhance the optical coupling between the at least one nanostructure and the optical fiber may further include initially dispersing the nanostructures into a photopolymerizable coating prior to suspension within the fluid, such that the photopolymerizable coating coats the nanostructures. The example method to enhance the optical coupling between the at least one nanostructure and the optical fiber may further include affixing the at least one nanostructure to the first end of the optical fiber to form a nanostructure-optical fiber assembly.

According to some examples, affixing the at least one nanostructure to the first end of the optical fiber may further include directing a pulsed ultraviolet laser light through the optical fiber causing a portion of a photopolymerizable coating of the at least one nanostructure to polymerize near the first end of the optical fiber. Polymerizing the portion of the optical fiber may include two-photon polymerization. Affixing the at least one nanostructure to the first end of the optical fiber may further include forming a chemical bond between the at least one nanostructure and the first end of the optical fiber to form the nanostructure-optical fiber assembly. Forming the chemical bond may include forming the chemical bond between a functional group supported by the at least one nanostructure and the first end of the optical fiber, treating tips of the nanostructures with a fluidic polymer prior to suspension in the fluid, and solidifying the polymer at the tip of the at least one nanostructure in contact with the first end of the optical fiber.

According to some examples, the example method to enhance the optical coupling between the at least one nanostructure and the optical fiber may further include removing the nanostructure-optical fiber assembly from the fluid and employing the nanostructure-optical fiber assembly to optically couple the at least one affixed nanostructure and the optical fiber to a target device. In some examples, the example method may further include positioning the at least one affixed nanostructure next to a second nanostructure on the target device such that a portion of the at least one affixed nanostructure and a portion of the second nanostructure overlap over an interaction length and the pulsed ultraviolet laser light is transferred between the second nanostructure and the at least one affixed nanostructure over the overlapping interaction length. The example method may further include adjusting the interaction length to improve transfer of the pulsed ultraviolet laser light between the second nanostructure and the at least one affixed nanostructure. According to some examples, the example method may further include providing fluidic chambers. Each fluidic chamber may contain one or more of the nanostructures of different sizes and the nanostructures composed from a different material to enable selection of the nanostructures for a selected optical fiber size.

According to some examples, systems having an optical coupling between a nanostructure and an optical fiber are described, in some examples providing an enhanced coupling due to improved alignment. An example system may include a single mode optical fiber, nanostructures, and a light source. The single mode optical fiber may be tapered from a wider diameter at a second end to a narrower diameter at a first end. The nanostructures may be suspended in a microfluidic suspension fluid contained in a fluidic chamber, where the first end of the optical fiber may be configured to be inserted into the fluidic chamber. The light source may be coupled with the second end of the optical fiber to direct light through the optical fiber, where the light source may be one of a visible laser and an infrared laser and may be configured to induce an optical gradient force at the first end of the optical fiber such that the nanostructures are directed near the first end of the optical fiber and at least one nanostructure may be aligned with one of the first end of the optical fiber and a long axis of the at least one nanostructure parallel to a long axis of the optical fiber in response to the optical gradient force.

According to different examples, the nanostructures may have cross-sectional diameter in ranges from about ten to about several hundred nanometers. In some examples, the nanostructures may be dispersed in a photopolymerizable coating prior to suspension within the fluid.

According to some examples, methods to fabricate a nanostructure-optical fiber assembly coupled with a target device are provided. An example method may include suspending nanostructures in a suspension fluid to form a nanostructure suspension, inserting a first end of an optical fiber into the nanostructure suspension, and coupling a light source with a second end of the optical fiber. The example method may additionally include directing light from the light source into the second end of the optical fiber to induce an optical gradient force at the first end of the optical fiber such that at least one nanostructure is aligned with the first end of the optical fiber due to the optical gradient force and affixing the at least one aligned nanostructure to the first end of the optical fiber to form a nanostructure-optical fiber assembly. The example method may also include optically coupling the nanostructure-optical fiber assembly to the target device, removing the nanostructure-optical fiber assembly from the nanostructure suspension prior to optically coupling the nanostructure-optical fiber assembly to the target device, and inserting the at least one affixed nanostructure to the optical fiber within a registration groove of the target device.

According to further examples, the target device may be an integrated nanophotonic component. The target device may include at least a second nanostructure affixed on a substrate. According to some examples, affixing the at least one nanostructure to the first end of the optical fiber may include directing a pulsed laser light through the optical fiber to illuminate the at least one nanostructure. Affixing the at least one nanostructure to the first end of the optical fiber may further include solidifying a polymer applied near a tip of the at least one nanostructure in contact with the first end of the optical fiber employing two-photon polymerization.

According to some examples, the example method to fabricate the nanostructure-optical fiber assembly coupled with the target device may further include positioning the at least one affixed nanostructure next to a second nanostructure on the target device such that a portion of the at least one affixed nanostructure and a portion of the second nanostructure overlap over an interaction length and adjusting the interaction length to improve transfer of light between the second nanostructure and the at least one affixed nanostructure.

According to some examples, methods to form an assembly comprising a nanostructure and an optical fiber, the optical fiber having a fiber end, are provided. An example method may include placing the fiber end into a nanostructure suspension, the nanostructure suspension comprising nanostructures suspended in a fluid, the nanostructures including the nanostructure. The example method may also include aligning the nanostructure with the fiber end by emitting light from the fiber end to create an optical gradient force proximate the fiber end, and affixing the nanostructure to the fiber end to form the assembly comprising the nanostructure and the optical fiber.

In other examples, the fiber end may be a tapered end. Emitting light from the fiber end may include emitting the light from a tapered portion of the fiber end. Aligning the nanostructure with the fiber end may include emitting the light as laser radiation from the fiber end. Aligning the nanostructure with the fiber end may include emitting the light as visible or IR radiation from the fiber end.

In further examples, affixing the nanostructure may include increasing an intensity of light emitted from the fiber end. Affixing the nanostructure may also include changing a wavelength of light emitted from the fiber end. Affixing the nanostructure may further include forming a polymer layer between the fiber and the nanostructure, where forming a polymer layer between the fiber and the nanostructure may include polymerizing a polymerizable component of the fluid. The nanostructure may be selected from a group of nanostructures consisting of a nanorod, a nanowire, a nanostructure, a nanotube, and a nanodisk.

According to some embodiments, optical probes are described. An example optical probe may include an optical fiber having a tapered end, a polymer layer disposed around an end portion of the tapered end, and a nanostructure affixed to the end portion of the tapered end by the polymer layer.

In other embodiments, the polymer layer may comprise a photopolymer. The nanostructure may be elongated. The nanostructure may be an elongated nanostructure, such as a nanorod, nanowire, or nanotube, where a direction of elongation of the nanostructure may be aligned with a direction of elongation of the optical fiber.

There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and/or firmware would be possible in light of the disclosure.

The present disclosure is not to be limited in terms of the particular embodiments described in the application, which are intended as illustrations of various aspects. Many modifications and variations can be made without departing from its spirit and scope. Functionally equivalent methods and apparatuses within the scope of the disclosure, in addition to those enumerated herein, will be possible from the foregoing descriptions. Such modifications and variations are intended to fall within the scope of the appended claims. The present disclosure includes the terms of the appended claims, along with the full scope of equivalents to which such claims are entitled. It is to be understood that the disclosure is not limited to particular methods, systems, or components, which can, of course, vary. It is also to be understood that the terminology used herein is for the purpose of describing particular embodiments, and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that particular functionality is achieved. Hence, any two components herein combined to achieve a particular functionality may be seen as "associated with" each other such that the particular functionality is achieved, irrespective of architectures or intermediate components. Likewise, any two components so associated may also be viewed as being "operably connected," or "operably coupled," to each other to achieve the particular functionality, and any two components capable of being so associated may also be viewed as being "operably couplable," to each other to achieve the particular functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. For example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to enhance optical coupling between at least one nanostructure and an optical fiber, the method comprising:
   suspending nanostructures in a fluid to form a nanostructure suspension, the nanostructures including the at least one nanostructure and a polarizable material;
   inserting a first end of the optical fiber into the nanostructure suspension;
   coupling a light source to a second end of the optical fiber;
   directing light from the light source into the second end of the optical fiber to induce an optical gradient force within the nanostructure suspension proximate to the first end of the optical fiber such that the at least one nanostructure is aligned by the induced optical gradient force at the first end of the optical fiber; and
   affixing the at least one nanostructure to the first end of the optical fiber to form a nanostructure-optical fiber assembly, wherein affixing the at least one nanostructure to the first end of the optical fiber further comprises:
      directing a pulsed ultraviolet laser light through the optical fiber causing a portion of a photopolymerizable coating of the at least one nanostructure to polymerize near the first end of the optical fiber, wherein polymerizing the portion of the optical fiber includes two-photon polymerization;
      forming a chemical bond between the at least one nanostructure and the first end of the optical fiber to form the nanostructure-optical fiber assembly, wherein forming the chemical bond includes forming the chemical bond between a functional group supported by the at least one nanostructure and the first end of the optical fiber;
      treating tips of the nanostructures with a fluidic polymer prior to suspension in the fluid; and
      solidifying the polymer at the tip of the at least one nanostructure in contact with the first end of the optical fiber.

2. The method of claim 1, wherein suspending the nanostructures in the fluid comprises:
   suspending the nanostructures in a microfluidic suspension fluid contained in a fluidic chamber, wherein the nanostructures include one or more of a semiconductor, an oxide, and a metal.

3. The method of claim 1, further comprising:
   forming a taper of the optical fiber near the first end employing one or more of chemical etching, mechanical polishing, and drawing a region of the optical fiber through a heating zone.

4. The method of claim 1, wherein the light source is one of an infrared laser and a visible laser.

5. The method of claim 1, wherein inserting the first end of the optical fiber into the nanostructure suspension comprises one or more of:
   translating the first end of the optical fiber within the fluid; and
   directing the nanostructures to flow near the first end of the optical fiber through one or more flow channels within a fluidic chamber comprising the fluid.

6. The method of claim 1, further comprising:
   inducing the optical gradient force such that the at least one nanostructure is attracted to the first end of the optical fiber and is aligned with a long axis of the at least one nanostructure parallel to a long axis of the optical fiber in response to the optical gradient force.

7. The method of claim 1, further comprising:
   forming the nanostructures by one of a solution employing chemical synthesis and via epitaxial growth on a substrate employing a vapor-liquid-solid (VLS) method, wherein the nanostructures are one of nanowires and single crystal nanostructures.

8. The method of claim 1, wherein the nanostructures have a root mean square (RMS) surface roughness in a range from about 0.1 to about 0.2 nanometers.

9. The method of claim 1, further comprising:
   initially dispersing the nanostructures into a photopolymerizable coating prior to suspension within the fluid, such that the photopolymerizable coating coats the nanostructures.

10. The method of claim 1, further comprising:
    removing the nanostructure-optical fiber assembly from the fluid; and
    employing the nanostructure-optical fiber assembly to optically couple the at least one affixed nanostructure and the optical fiber to a target device.

11. The method of claim 10, further comprising:
    positioning the at least one affixed nanostructure next to a second nanostructure on the target device such that a portion of the at least one affixed nanostructure and a portion of the second nanostructure overlap over an interaction length and the pulsed ultraviolet laser light is transferred between the second nanostructure and the at least one affixed nanostructure over the overlapping interaction length; and
    adjusting the interaction length to improve transfer of the pulsed ultraviolet laser light between the second nanostructure and the at least one affixed nanostructure.

12. The method of claim 1, further comprising:
    providing fluidic chambers, wherein each fluidic chamber contains one or more of the nanostructures of different sizes and the nanostructures composed from a different material to enable selection of the nanostructures for a selected optical fiber size.

13. A method to fabricate a nanostructure-optical fiber assembly coupled with a target device, the method comprising:
    suspending nanostructures in a suspension fluid to form a nanostructure suspension;
    inserting a first end of an optical fiber into the nanostructure suspension;
    coupling a light source with a second end of the optical fiber;
    directing light from the light source into the second end of the optical fiber to induce an optical gradient force at the first end of the optical fiber such that at least one nanostructure is aligned with the first end of the optical fiber due to the optical gradient force;
    affixing the at least one aligned nanostructure to the first end of the optical fiber to form a nanostructure-optical fiber assembly;
    removing the nanostructure-optical fiber assembly from the nanostructure suspension;
    optically coupling the nanostructure-optical fiber assembly to the target device; and
    inserting the at least one affixed nanostructure to the optical fiber within a registration groove of the target device to fabricate the nanostructure-optical fiber assembly coupled with the target device.

14. The method of claim 13, wherein the target device is an integrated nanophotonic component and includes at least a second nanostructure affixed on a substrate.

15. The method of claim 13, wherein affixing the at least one nanostructure to the first end of the optical fiber comprises:
- directing a pulsed laser light through the optical fiber to illuminate the at least one nanostructure; and
- solidifying a polymer applied near a tip of the at least one nanostructure in contact with the first end of the optical fiber employing two-photon polymerization.

16. The method of claim 13, further comprising:
- positioning the at least one affixed nanostructure next to a second nanostructure on the target device such that a portion of the at least one affixed nanostructure and a portion of the second nanostructure overlap over an interaction length; and
- adjusting the interaction length to improve transfer of light between the second nanostructure and the at least one affixed nanostructure.

* * * * *